(12) United States Patent
Yamada

(10) Patent No.: US 7,227,778 B2
(45) Date of Patent: Jun. 5, 2007

(54) SEMICONDUCTOR DEVICE AND WRITING METHOD

(75) Inventor: Shigekazu Yamada, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 19 days.

(21) Appl. No.: 11/194,023

(22) Filed: Jul. 29, 2005

(65) Prior Publication Data

US 2006/0176742 A1 Aug. 10, 2006

Related U.S. Application Data

(63) Continuation of application No. PCT/JP2004/010914, filed on Jul. 30, 2004.

(51) Int. Cl.
*G11C 11/34* (2006.01)
*G11C 16/06* (2006.01)

(52) U.S. Cl. ............... 365/185.05; 365/185.03; 365/185.22; 365/189.05

(58) Field of Classification Search ........... 365/185.05, 365/185.03, 185.22, 189.01, 189.04, 189.05
See application file for complete search history.

(56) References Cited

U.S. PATENT DOCUMENTS

| 5,570,315 | A | 10/1996 | Tanaka et al. | ............ 365/185 |
|---|---|---|---|---|
| 6,046,936 | A | 4/2000 | Tsujikawa | ............ 365/185 |
| 6,118,697 | A | 9/2000 | Tanzawa et al. | ............ 365/185 |
| 6,807,096 | B2 * | 10/2004 | Toda | ............ 365/185.03 |
| 6,996,003 | B2 * | 2/2006 | Li et al. | ............ 365/185.02 |
| 2004/0027901 | A1 | 2/2004 | Shiga et al. | |

FOREIGN PATENT DOCUMENTS

| JP | 7-93979 | 4/1995 |
|---|---|---|
| JP | 9-91971 | 4/1997 |
| JP | 11-73789 | 3/1999 |
| JP | 11-073790 | 3/1999 |
| JP | 11-353886 | 12/1999 |
| JP | 11-232886 | 4/2000 |
| JP | 2000-251484 | 9/2000 |
| JP | 2004-22112 | 1/2004 |
| JP | 2004-192789 | 7/2004 |

* cited by examiner

*Primary Examiner*—Anh Phung
*Assistant Examiner*—Toan Le

(57) ABSTRACT

A semiconductor device has a memory cell array including a multi-level memory cell having multiple and different threshold values, a first latch circuit latching information of multiple-word of input information, a second latch circuit latching write information in which the information of the multiple-word of the input information is converted into information according to each level of the multi-level memory cell, a write circuit writing information into the multi-level memory cell on a group basis corresponding to the number of memory cells simultaneously programmable, according to the write information, and a control circuit controlling programming the memory cell array. The information is simultaneously programmed on the group basis into which multiple-word input information is divided, and makes it possible to shorten a program period substantially on a word basis. The program period is not increased, even if programming and verification are repeated several times in programming the multi-level memory cell.

16 Claims, 13 Drawing Sheets

SEMICONDUCTOR DEVICE AND WRITING METHOD

CROSS REFERENCE TO RELATED APPLICATIONS

This is a continuation of International Application No. PCT/JP2004/010914, filed Jul. 30, 2004.

BACKGROUND OF THE INVENTION

1. Field of the Invention

This invention generally relates to semiconductors and writing methods, and more particularly, to a semiconductor device having a multi-level memory cell and a method for writing data into the multi-level memory cell.

2. Description of the Related Art

The semiconductor memories are categorized into volatile ones that lose the information therein and non-volatile ones that retain the information therein, when the power turns off. Flash memories, in which the rewriting time is shortened by erasing the data at one time, are well known as a representative of the non-volatile ones.

FIG. 1 is a block diagram of programming a flash memory that does not have a write buffer for SLC (Single Level Cell) therein. In this flash memory, programming is performed for each one word (16 bits). As shown in FIG. 1, a flash memory 1 includes an input buffer 2, a write latch circuit 3, write voltage applying circuit 4, a memory cell array 5, a sense amplifier circuit 6, a comparator circuit 7, and a control circuit 8. The input buffer 2 retains a user write data. The write latch circuit 3 latches the user write data applied from the input buffer 2.

The write voltage applying circuit 4 writes the data into the memory cell to be associated with the write data. The sense amplifier circuit 6 reads out the data of the memory cell in a verify period, and the comparator circuit 7 compares the read-out data with the write data input from the outside. If the memory cell is sufficiently programmed, the write latch circuit 3 inverts the write data in the latch therein, and completes programming. On the other hand, if the memory cell is not sufficiently programmed, the write latch circuit 3 continues programming. The comparator circuit 7 determines whether all bits have passed. If all the bits have passed, the control circuit 8 controls the program operation at the next level.

Also, the flash memory having MLC (Multi Level Cell) has conventionally been proposed. The product type having the multi-level cell has four threshold levels, level 1, level 2, level 3, and level 4. The higher the level becomes, the higher the threshold level is configured. The aforementioned four levels compose two kinds of output (or input) data. Generally, at the time of programming the data of level 4, the writing method of going through the level 1 through the level 3 to reach the level 4.

Patent Document 1 proposes a semiconductor memory device having a binary data register that retains the write data that has been input. In addition, Patent Document 2 proposes another semiconductor device having a data latch circuit that latches the write data applied from the outside and a sense latch circuit that latches the write control information.

Patent Document 1: Japanese Patent Application Publication No. 11-73790

Patent Document 2: Japanese Patent Application Publication No. 11-232886

Programming the multi-level memory cell, however, has a concern of over programming that exceeds the level, and programming has to be performed to increase the threshold voltage Vth little by little. In the aforementioned programming method, programming and verification have to be repeated several times, causing a problem in that a programming period increases. The devices described in Patent Document 1 and Patent Document 2 cannot solve the problem of increasing the programming period.

SUMMARY OF THE INVENTION

The present invention has an object of solving the above-mentioned problems in the conventional techniques and provides a semiconductor device that can shorten a programming period on a word basis or provides a data writing method.

According to an aspect of the present invention, preferably, there is provided a semiconductor device including a first latch circuit that latches write information of multiple words, into which multiple-word input information is changed based on levels of a multi-level memory cell, and a write circuit that writes the write information of multiple words on a group basis in which one group is associated with a plurality of memory cells that are simultaneously programmable. According to the present invention, the information is programmed on the group basis into which the multiple words of input information are divided, and makes it possible to shorten a program period substantially. This does not increase the program period, even if the programming and verification have to be repeated in a multi-level memory cell.

The aforementioned semiconductor device may further include a second latch circuit that changes the multiple-word input information to the write information of multiple words and transfers the write information thus obtained to the first latch circuit. According to the present invention, multiple words of input information can be transformed into the information corresponding to each level of the multi-level memory cell.

On the semiconductor device, the first latch circuit may transfer the write information to the write circuit on the group basis. According to the present invention, the multiple words of input information are simultaneously programmable on a divided group basis.

On the semiconductor device, the first latch circuit may include circuits that are equal in number to circuits that form the second latch circuit and are greater in number than circuits that form the write circuit.

The above-mentioned semiconductor device may further include a control circuit that generates a signal that instructs verification and programming on the group basis. According to the present invention, by performing verify operation and program operation on the group basis, the program period can be shortened substantially on a word basis. The above-mentioned semiconductor device may further include a control circuit that generates a signal for repetitive verification and programming on a multiple-group basis. As compared to repetitive verification and programming on the group basis, it is possible to operate on the multiple-group basis by repeating the verification and programming on the multiple-group basis.

The above-mentioned semiconductor device may further include a determination circuit that determines whether verification for a group passes, wherein the control circuit finishes verification and programming for a group for which the verification has passed. According to the present invention, verification and programming of an unnecessary group can be eliminated. This makes it possible to accelerate the substantial program period on the word basis.

The above-mentioned semiconductor device may further include a control circuit that generates a signal that passes verification for a word that is not selected in a group. According to the present invention, verify data is made to pass on the verification, although the verify data is a word that is not accessed by the user in a group and is read out of the memory cell and makes it possible to shorten the program period substantially on the word basis.

The above-mentioned semiconductor device may further include a control circuit, wherein when the memory cell is sufficiently programmed at a first level, the control circuit generates a signal that instructs the memory cell to be programmed at a second level. According to the present invention, a given level can be programmed into the multi-level memory cell.

According to another aspect of the present invention, preferably, there is provided a method including the steps of changing multiple-word input information to write information of words based on levels of a multi-level memory cell, and writing the write information of multiple words on a group basis in which one group has associated therewith a number of memory cells that are simultaneously programmable. According to the present invention, the information is programmed on the group basis into which the multiple words of input information are divided, and makes it possible to shorten the program period substantially. This does not increase the program period, even if the programming and verification have to be repeated in the multi-level memory cell.

The aforementioned method may further include a step of repetitively performing verification and programming on the group basis. According to the present invention, by performing verify operation and program operation on the group basis, the program period can be shortened substantially on the word basis. The aforementioned method may further include a step of repetitively performing verification on a multiple-group basis. As compared to repetitive verification and programming on the group basis, it is possible to operate on the multiple-group basis by repeating the verification and programming on the multiple-group basis.

The aforementioned method may further include the steps of determining whether verification for a group passes, and finishing verification and programming for a group for which verification has passed. According to the present invention, verification and programming of an unnecessary group can be eliminated. This makes it possible to accelerate the substantial program period on the word basis.

The aforementioned method may further include a step of passing verification for a word that is not selected in a group. According to the present invention, verify data is made to pass on the verification, although the verify data is a word that is not accessed by the user in a group and is read out of the memory cell and makes it possible to shorten the program period substantially on the word basis.

The aforementioned method may further include a step of, when the memory cell is sufficiently programmed at a first level, generating a signal that instructs the memory cell to be programmed at a second level. According to the present invention, a given level can be programmed into the multi-level memory cell.

DESCRIPTION OF THE PREFERRED EMBODIMENTS

A description will now be given, with reference to the accompanying drawings, of embodiments of the present invention.

Embodiments

Figure 1:
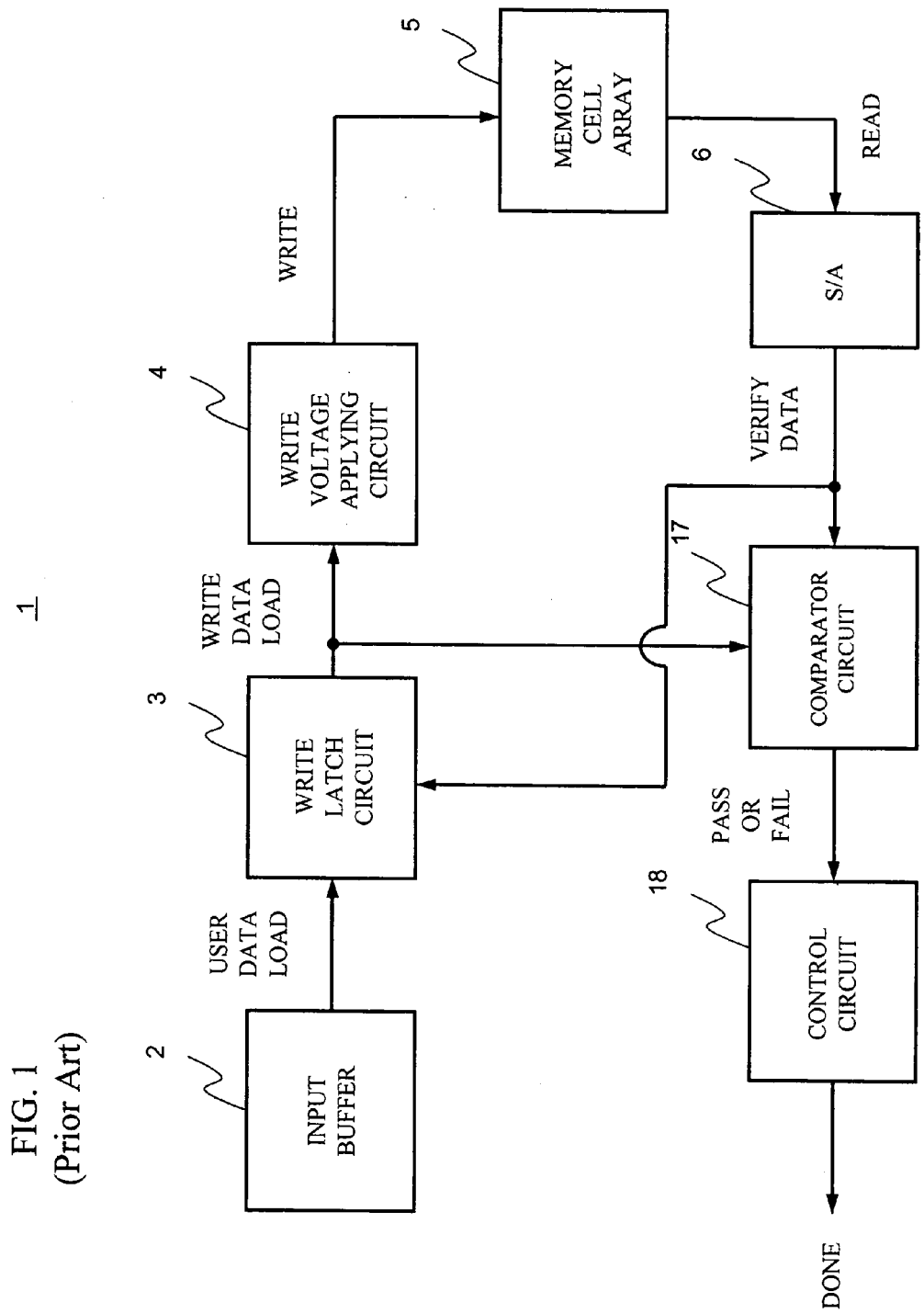
FIG. 1 is a block diagram of programming in a conventional semiconductor device.
Figure 2:
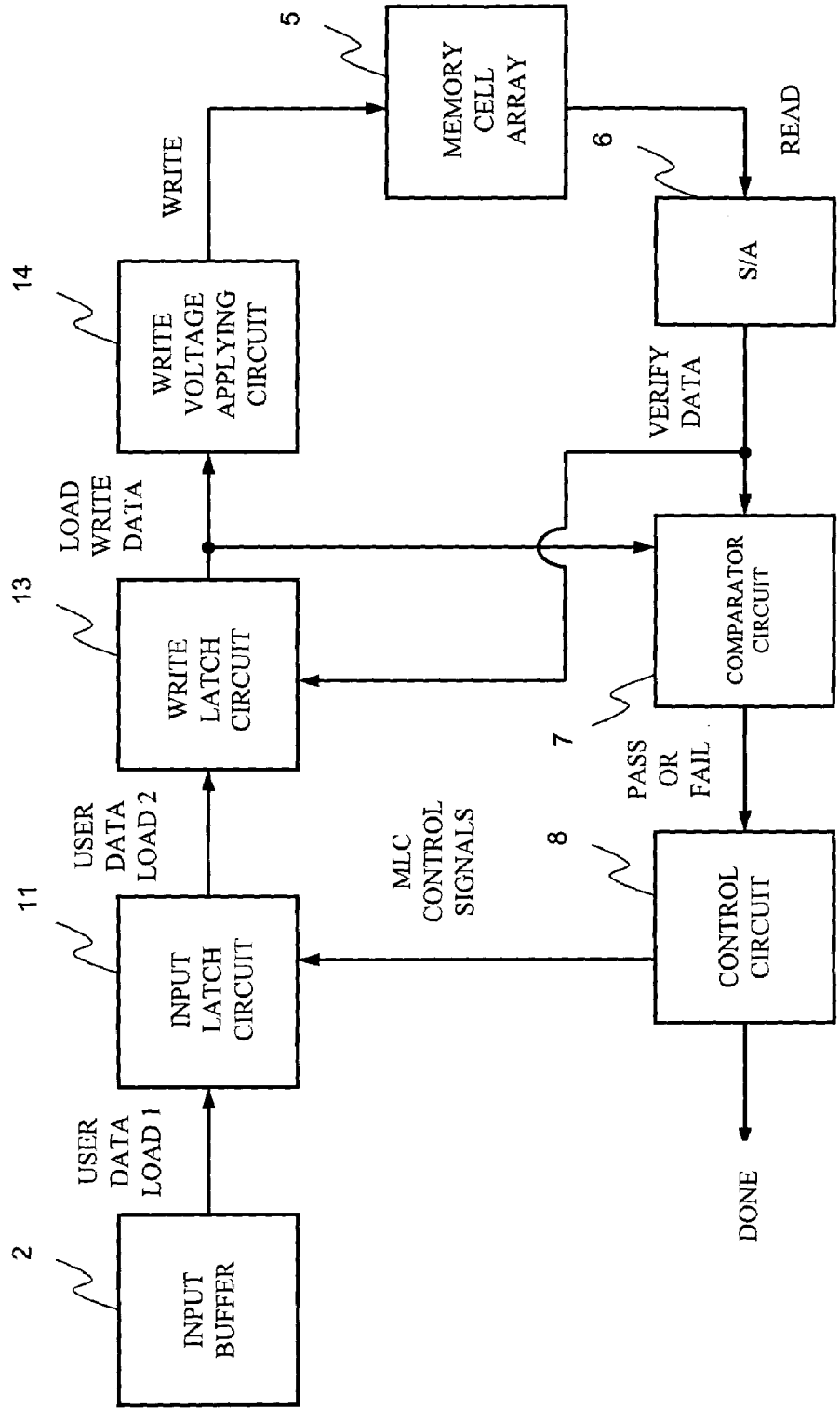
FIG. 2 is a block diagram of programming in a semiconductor device embodying the invention.

FIG. 2 is a block diagram of writing a semiconductor device 10 embodying the present invention. As shown in FIG. 2, the semiconductor device 10 includes the input buffer 2, an input latch circuit 11, a write latch circuit 13, a write voltage applying circuit 14, the memory cell array 5, the sense amplifier circuit 6, a comparator circuit 17, and a control circuit 18. A multi-level memory cell of two bits will be described as follows. In the multi-level memory cell of two bits, the level 1, the level 2, the level 4, and the level 4 are respectively defined as (1,1), (0,1), (1,0), and (0,0), namely, twp input and output data.

The semiconductor device 10 includes a write circuit for the multi-level memory cell that uses the write buffer. The semiconductor device 10 performs the data writing method. The semiconductor device 10 may be a semiconductor memory device in which only the semiconductor device is packaged such as a flash memory, or may be incorporated into the semiconductor device as one part. The input buffer 2 retains the input data of one word to be input by way of 16 I/O terminals from the outside.

The input latch circuit 11 latches the information of the input data included in multiple data that are sequentially input from the outside by way of the input buffer 2. That is, the input latch circuit 11 latches the input information of (1,1), (0,1), (1,0), and (0,0). The input latch circuit 11 is configured to latch 2-bit data. Therefore, eight input latch circuits 11 are needed for latching the data having one word of 16 bits. So, in order to latch the data for 16 words, 128 (16×8=128) input latch circuits 11 have to be provided. In the present embodiment, the input latch circuit 11 is equal in number to the write latch circuit 13, and is greater in number than the write voltage applying circuit 14. The write buffer of the present invention is composed of the input latch circuit 11, the write latch circuit 13, and the write voltage applying circuit 14.

The input latch circuit 11 processes a pair of the data input from an odd-numbered I/O terminal and that input from an even-numbered I/O terminal, converts the input data of multiple words into the write data of multiple words according to each level of the multi-level memory cell, and transfers to the write latch circuit 3.

Here, the aforementioned each level include the level 1, the level 2, the level 3, and the level 4. As the multi-level memory cell, there may employ a type of multi-level memory cell in which the four pieces of information are stored by storing electrons having different sizes in the floating gate, or another type in which an electron trap layer of nitride film or the like is provided instead of the floating gate.

The write latch circuit 13 latches the write information transferred from the input latch circuit 11. The write latch circuit 13 latches the write data as a memory cell level. The data having 16 bits of one word is converted into eight pieces of the write information, and accordingly, 16×8=128, namely, 128 write latch circuits 13 have to be provided for latching 16 words. The write latch circuit 13 divides multiple pieces of the word information retained by the write buffer according to the number of the memory cells simultaneously programmable, and sequentially transfers to the write voltage applying circuit 14 on a group basis. Here, the write latch circuit 13 divides 16 words into four groups, each of which has four words, and sequentially transfers to the write voltage applying circuit 14 on the group basis. In other words, the write latch circuit 13 loads four words.

The write voltage applying circuit 14 writes into the multi-level memory cell, the write information transferred from the write latch circuit 13 on a group basis to be associated with the number of the memory cells simultaneously programmable. In a writing method for the multi-level memory cell, the threshold value Vth is increased little by little, and much write current is not consumed. This makes it possible to program more cells than ever. 16 words is the number that the write buffer can retain as the data, 32 cells is the number to be programmable, and the write voltage applying circuit 14 employs a method for applying a write pulse four times for every write operation. In this manner, the write voltage applying circuit 14 programs 32 cells simultaneously on one group.

The memory cell array 5 includes interconnections, word lines, bit lines, and the like of the multi-level memory cell transistor having multiple different threshold values, and stores the data in each memory cell transistor. The data is read out of the memory cell designated by an activated word line, into the bit line at the time of reading the data. By setting the word line and the bit line to appropriate potentials according to the respective operations at the time of programming or erasing, an electron is injected into or extracted from the memory cell.

The sense amplifier circuit 6 converts the current of the data in the designated memory cell, the current being applied from the memory cell array, into the voltage, and transfers the read-out data to the comparator circuit 17 and the latch circuit 13.

The comparator circuit 17 compares the read-out data with the write data, and transfers a comparison result to the control circuit 18. The write voltage applying circuit 14 programs the memory cell again, if it is determined that the memory cell is not sufficiently programmed. The write voltage applying circuit 14 inverts the internal write data and completes one program operation, if the memory cell is sufficiently programmed at a given level. The comparator circuit 17 determines whether the verification has passed for each group.

The control circuit 18 receives a control signal from the outside, receives a command from a command register (not shown) at the same time, operates as a state machine, and controls every part of the semiconductor device 10. In particular, the control circuit 18 controls programming the memory cell array 5.

The control circuit 18 generates a write control signal of the next level, and transfers to the input latch circuit 11, if the multi-level memory cell is sufficiently programmed at a given level. The input latch circuit 11 converts the input data of the multiple words that have been stored into the write data, and transfers to the write latch circuit 13. The control circuit 18 repeats the aforementioned processes, and completes the whole program operation when the user write data corresponds to the memory cell data completely.

Figure 3:
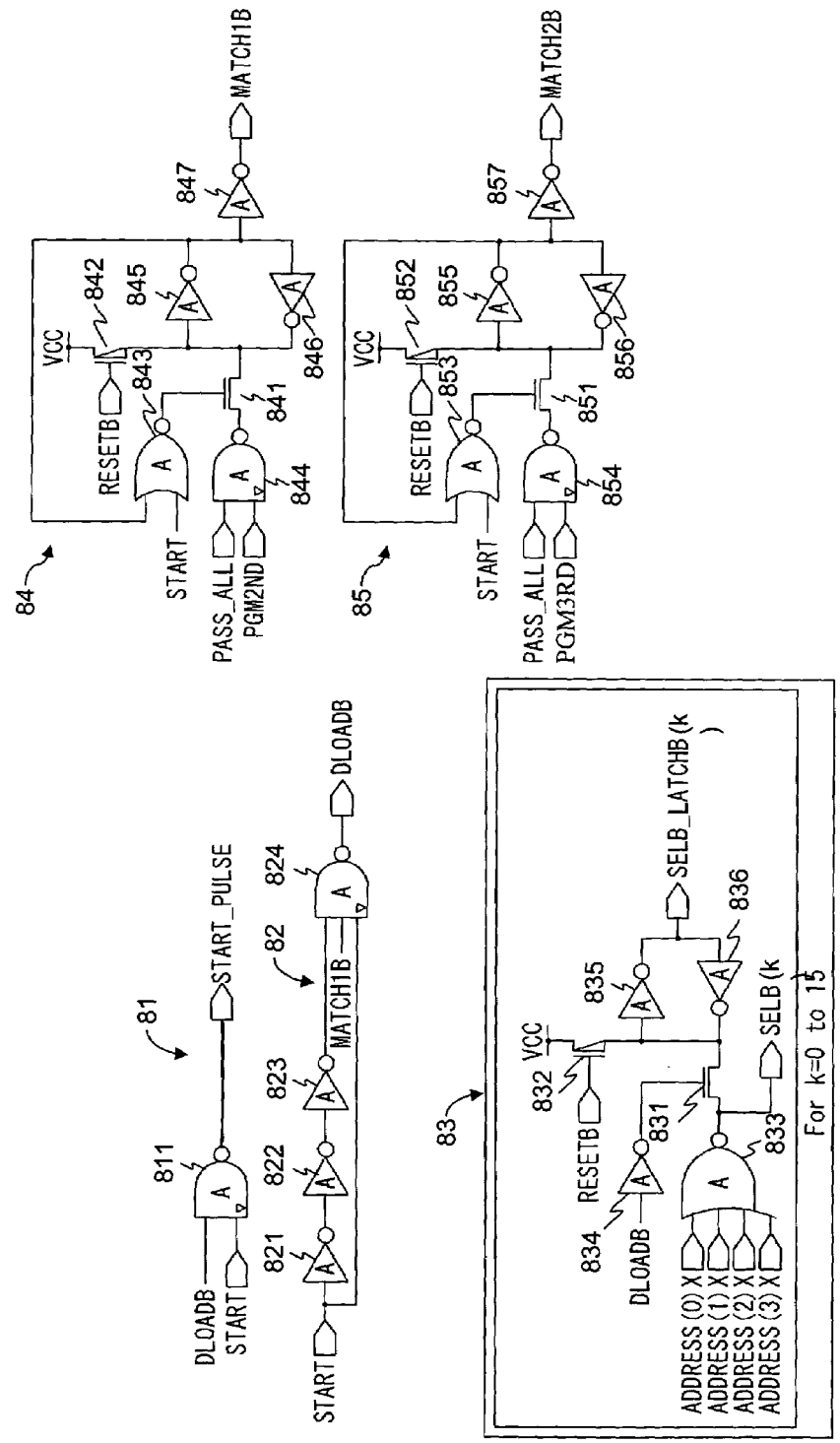
FIG. 3 is a view showing an example of control logic that generates various control signals in a write buffer in a control circuit 18.

Next, a description will be given of the control circuit 18. FIG. 3 is an example of a control logic that generates various control signals in the write buffer.

As shown in FIG. 3, the control circuit 18 includes circuits 81 through 85. The circuit 81 includes a NAND circuit 811. The circuit 81 generates a signal STRAT_PULSE with a signal DLOADB and a signal START. The signal STRAT_PULSE is a short pulse that generates at the beginning of each program flow, and is input into the write latch circuit 13.

The circuit 82 includes inverters 821 through 823 and a NAND circuit 824. The circuit 82 generates a signal DLOADB with the signal START and a signal MATCH1B. The signal DLOADB becomes low in an initial stage of program operation. After receiving the signal DLOADB, the user input data is transferred to the input latch circuit 11 from the input buffer 2.

The circuit 83 includes an NMOS transistor 831, a PMOS transistor 832, a NOR circuit 833, and inverters 834 through 837. The circuit 83 generates a signal SELB(k) and a signal SELB_LATCHB(k) with ADDRESS(3:0)X and the signal DLOADB. Here, k varies from 0 to 15, and shows which word in 16 words the signal is associated with. 16 circuits 83 have to be provided for controlling the write buffer of 16 words. According to the ADDRESS(3:0)X, the information on which word is selected by the user is set in the latch composed of inverters 835 and 836.

Here, the ADDRESS(3:0)X is a word select address input by the user, and denotes all combinations (16 combinations) of the ADDRESS(3:0) and complementary signal address ADDRESS(3:0)B thereof. The signal SELB_LATCHB(k) is set to a low level, if the user selects a k-th word. The signal SELB_LATCHB(k) corresponding to an unselected word is set to a high level. This signal is used for controlling the verify data to pass on the verification and input into the comparator circuit 17, although the verify data is the word that is not accessed by the user in a write group of four words and read out of the memory cell.

The signal SELB(k) is a word decode signal in the write buffer, selects one word according to the word select address ADDRESS(3:0), and the selected word is set to a low level. At the time of programming, the user sequentially inputs word addresses and the data, and the corresponding signal SELB(n) becomes a low level in each case. The write data is sequentially stored in the input latch circuit 11.

The circuit 84 includes an NMOS transistor 841, a PMOS transistor 842, a NOR circuit 843, an NAND circuit 844, and inverters 845 through 847. The circuit 84 generates the signal MATCH1B with the signal START, a signal PAS- S_ALL, and a signal PGM2ND. The signal PASS_ALL becomes high, when the verification of all the cells passes. The data latched in the inverters 845 and 846 is output from an inverter 847 as the signal MATCH1B.

The circuit 85 includes an NMOS transistor 851, a PMOS transistor 852, a NOR circuit 853, an NAND circuit 854, and inverters 855 through 857. The circuit 85 generates a signal MATCH2B with the signal START, the signal PASS_ALL, and a signal PGM3RD. The data latched in the inverters 855 and 856 is output from an inverter 857 as the signal MATCH2B. The signal MATCH1B and the signal MATCH2B are input into the input latch circuit 11.

Figure 4:
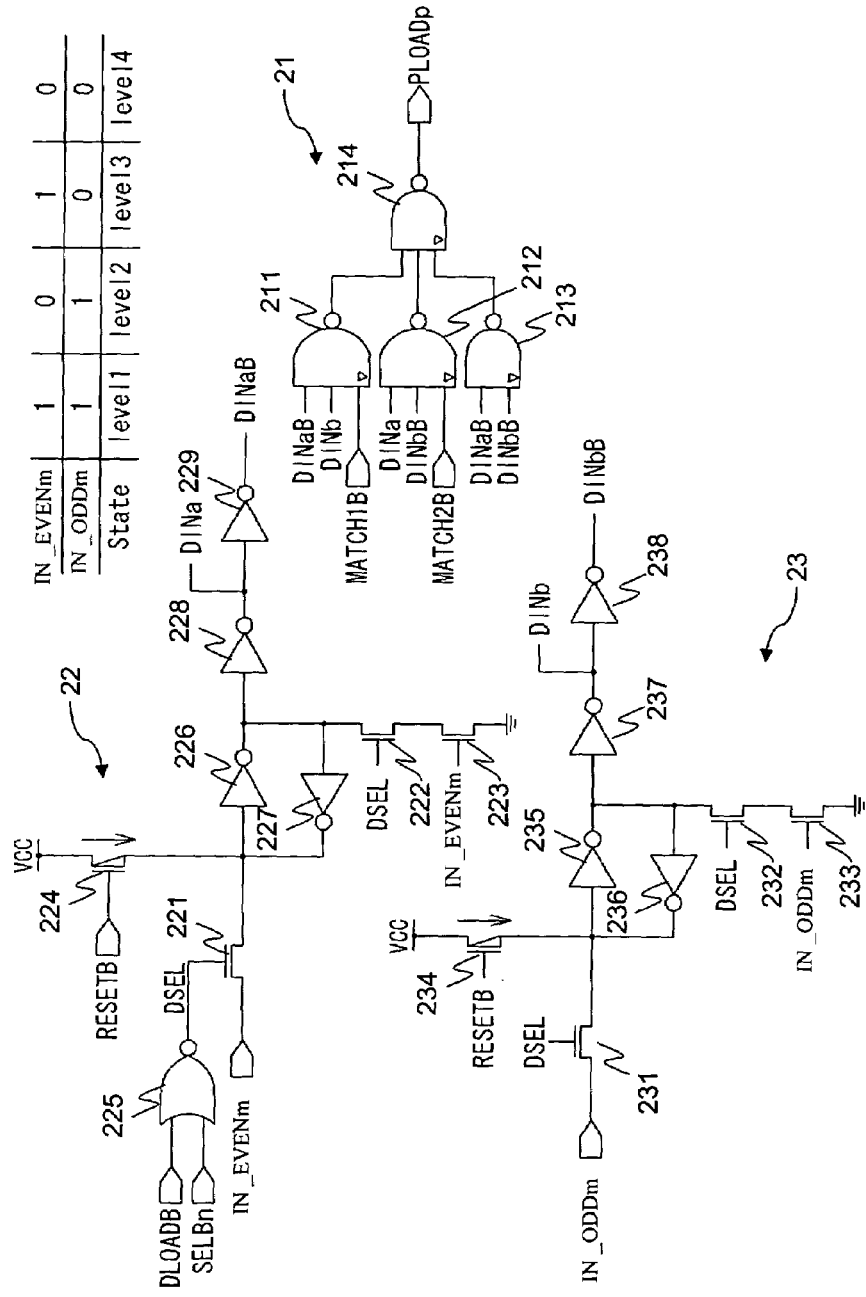
FIG. 4 is a view showing an input latch circuit embodying the invention.

Next, a description will be given of the input latch circuit 11. FIG. 4 is a view showing the input latch circuit embodying the invention. As shown in FIG. 4, the input latch circuit 11 includes circuits 21 through 23. The input latch circuit 11 converts two input data into one write data PLOADp. 128 input latch circuits 11 have to be provided for latching the data for 16 words. A description will be given with a PGM2ND defined as a program flow from the level 1 to the level 2, the PGM3RD defined as the program flow from the level 2 to the level 3, and PGM4TH defined as the program flow from the level 3 to the level 4.

The signal DLOADB becomes low in the initial stage of the program operation. After receiving the signal DLOADB, the user input data is transferred to the input latch circuit 11 from the input buffer 2. The signal SELB(k) is a word decode signal in the write buffer, and is transferred from the control circuit 18. There are 16 signals SELB(k) in the buffer of 16 words. A signal IN_EVENm and a signal IN_ODDm are varried with the user input data transferred from the input buffer 2. Here, m varies 0 to 7. The level 1 is represented when the signal IN_EVENm is high and the IN_ODDm is high. The level 2 is represented when the signal IN_EVENm is low and the IN_ODDm is high. The level 3 is represented when the signal IN_EVENm is high and the IN_ODDm is low. The level 4 is represented when the signal IN_EVENm is low and the IN_ODDm is low.

The signal MATCH1B becomes low when the PGM2ND completes. The signal MATCH2B becomes low when the PGM3RD completes. The signal MATCH1B and the signal MATCH2B are supplied from the control circuit 18. The circuit 22 includes NMOS transistors 221 through 223, a PMOS transistor 224, a NOR circuit 225, and inverters 226 through 229. When a signal RESETB is low, the signal DLOADB and the signal SELB(k) are low, and a signal DSEL is high, the user input data is input as the signals IN_EVENm and IN_ODDm, and is latched in the latch composed of the inverters 226 and 227. The inverter 228 generates a signal DINa, and the inverter 229 generates a signal DINaB. The signal DINa and the signal DINaB are input into the inverter circuit 21.

The circuit 23 includes NMOS transistors 231 through 233, a PMOS transistor 234, and inverters 235 through 238. When the signal RESETB is low, the signal DLOADB and the signal SELBn are low, and the signal DSEL is high, the user input data is input as the signals IN_EVENm and IN_ODDm, and is latched in the latch composed of the inverters 235 and 236. The inverter 237 generates a signal DINb, and the inverter 238 generates a signal DINbB. The signal DINb and the signal DINbB are input into the inverter circuit 21.

The inverter circuit 21 includes NAND circuits 211 through 214. The inverter circuit 21 inverts the data applied from the odd-numbered I/O terminal and the even-numbered I/O terminal, into one write data PLOAD. When the signal PLOAD is high, an instruction for writing is executed in the program flow. The signal MATCH1B and the signal MATCH2B are both high in the PGM2ND, and the user input data of any one of (0,1), (1,0), and (0,0) is high in the signal PLOADp. The signal MATCH1B is low and the signal MATCH2B is high in the PGM3RD, and the user input data of either (1,0) or (0,0) is high in the signal PLOADp. The signal MATCH1B is low and the signal MATCH2B is low in the PGM4TH, and only the user input data of (0, 0) is high in the signal PLOADp. In this manner, programming at a higher level is executed after passing through the lower level. The PLOADp is shown as PLOAD (3:0), and each PLOAD(n) includes 32 signals equal in number to the memory cells (for example, the number of memory cells for four words) simultaneously programmable.

Figure 5:
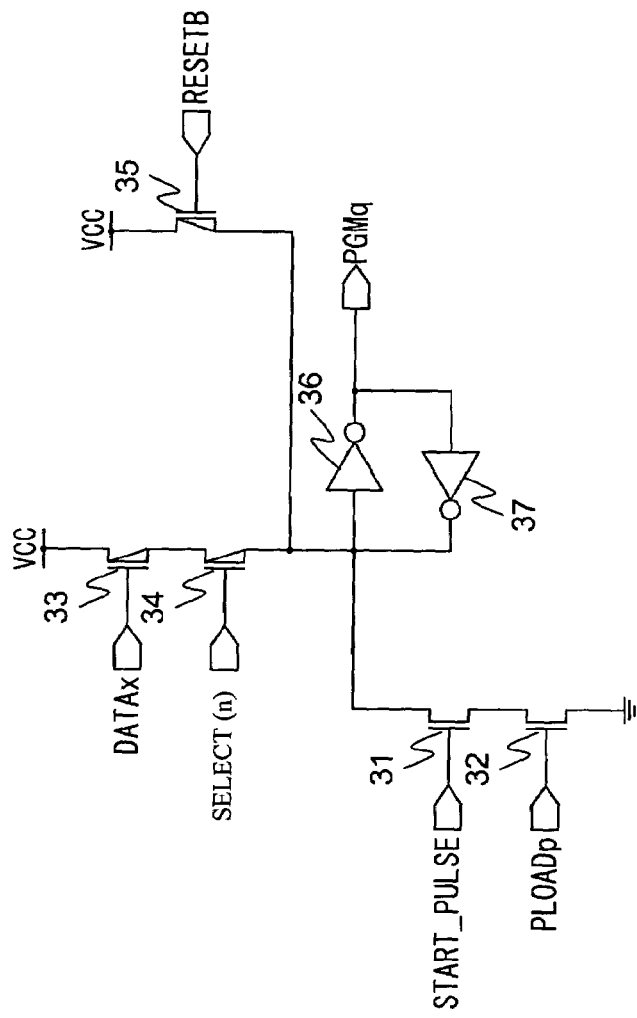
FIG. 5 is a view showing a write latch circuit for a multi-level memory cell.

Next, a description will be given of the write latch circuit 13. FIG. 5 is a view showing the write latch circuit 13 for multi-level memory cell. As shown in FIG. 5, each of the write latch circuits 13 includes NMOS transistors 31 and 32, PMOS transistors 33 through 35, and inverters 36 and 37. 128 write latch circuits 13 have to be provided for latching the data of 16 words.

The write latch circuit 13 divides 16 words into four groups, each of which has four words, and sequentially transfers to the write voltage applying circuit 14. A signal DATAx is a verify data applied from the sense amplifier circuit 6, and becomes low after passing programming. A signal SELECT(n) divides multiple-word information retained by the write buffer according to the number of the memory cell simultaneously programmable. The signal SELECT(n) is supplied from the control circuit 18. A signal START_PULSE is a short pulse that generates at the beginning of each program flow. The signal PLOADp is transferred from the input latch circuit 11 at the beginning of the program operation at each level.

When the signal START_PULSE is high and the signal PLOADP is high, the write data is set to the latch composed of the inverters 36 and 37. Then, an output PGMq is high, and becomes a state of programming. Here, the signal PGMq is represented as PGN(3:0). Each PGM(n) includes 32 signals equal in number to the memory cells (for example, the memory cells for four words) simultaneously programmable. If the sense amplifier circuit 6 determines that the memory cell is sufficiently programmed, the write latch circuit 13 receives the verify data DATAx of low. If the verify data DATAx is low and the signal SELECT(n) is low, the write data in the latch composed of the inverters 36 and 37 is inverted, and one program operation completes. Thus, the memory cell that has passed the verification is not programmed.

Figure 6:
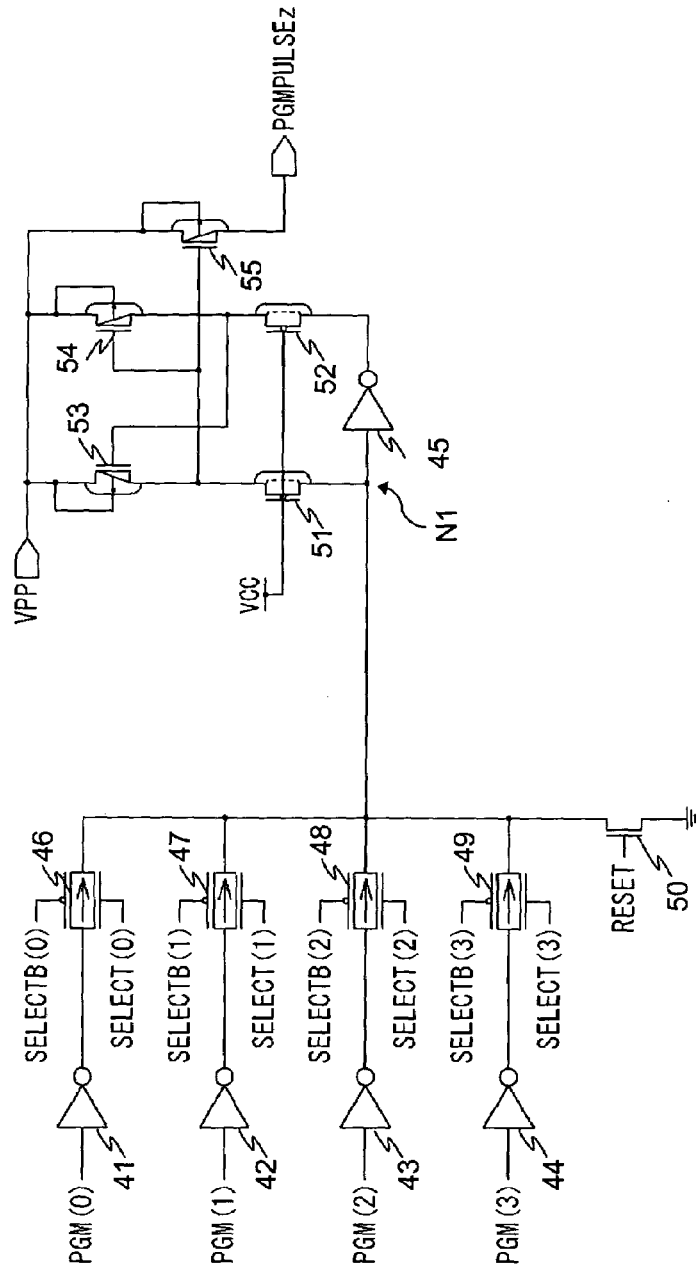
FIG. 6 is a view showing a write voltage applying circuit for the multi-level memory cell.

Next, a description will be given of the write voltage applying circuit. FIG. 6 is a view showing the write voltage applying circuit 14 for multi-level memory cell. There are provided only the aforementioned circuits equal in number to the memory cells simultaneously programmable (for example, 32 circuits for four words). As shown in FIG. 6, the write voltage applying circuit 14 includes inverters 41 through 45, transfer gates 46 through 49, NMOS transistors 50 through 52, and PMOS transistors 53 through 55. The gate of the NMOS transistor 50 is controlled by a signal RESET, and the gates of the NMOS transistors 51 and 52 are controlled by the power voltage VCC.

The signal SELECT(3:0) divides the multiple-word information retained by the write buffer according to the number of the memory cells simultaneously programmable, and becomes high at the time of programming or verifying each group. The signal SELECT(3:0) is generated by the control circuit 18. The signal PGM(3:0) is the write input data applied from the write latch circuit 13. The signal PGM(3:0) is selected by a signal SELECTB(3:0) and the signal SELECT(3:0). A signal of low is input into a node N1, and the transistor 55 for power supply turns on. Then, a program pulse PGMPULSEz is supplied to the selected memory cell. A signal of high is input into the node N1, and the transistor 55 for power supply turns off. The program pulse PGM-PULSEz is not supplied to the selected memory cell.

Figure 7:
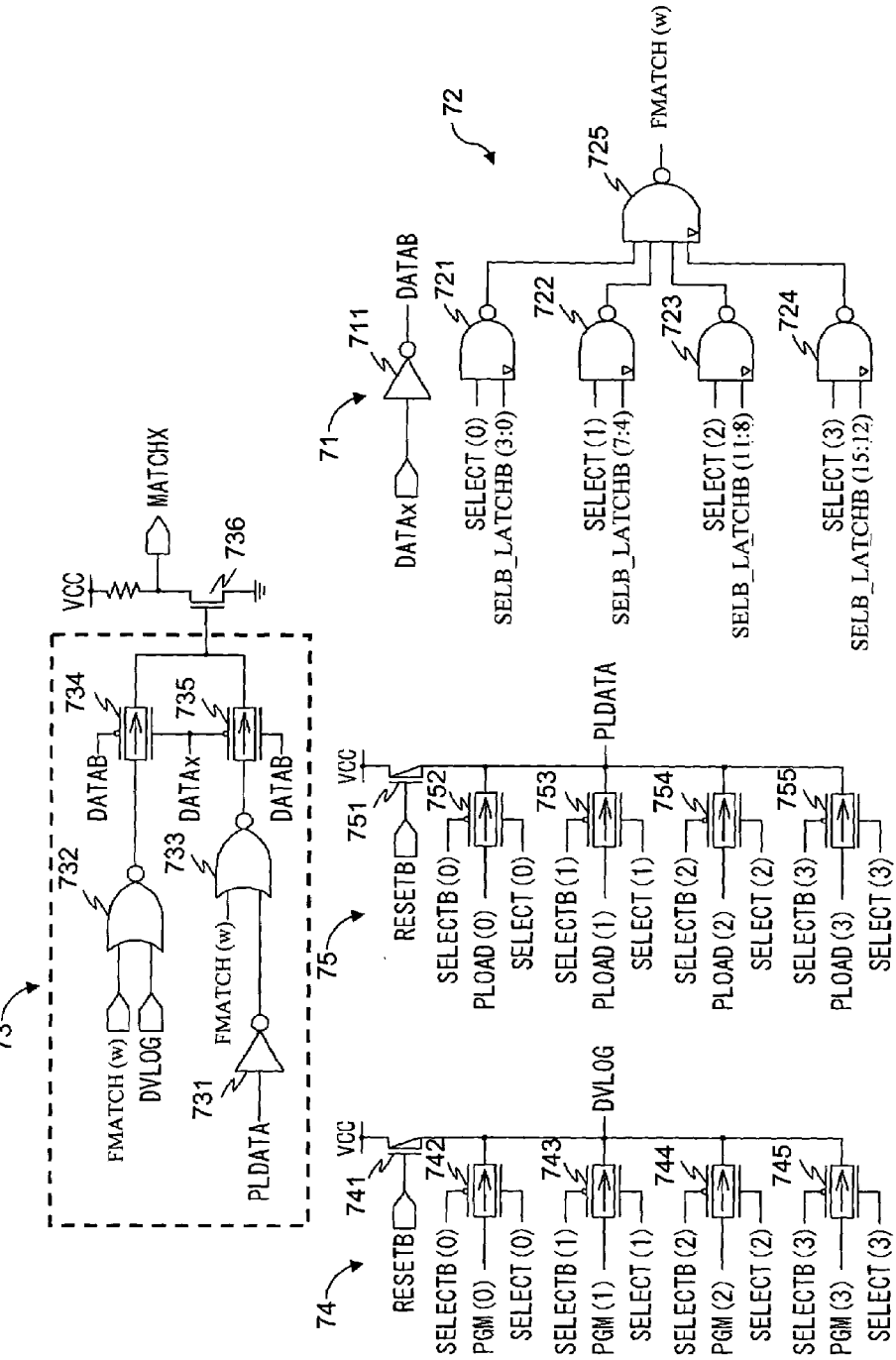
FIG. 7 is a view showing a comparator circuit for the multi-level memory cell.

Next, a description will be given of the comparator circuit 17. FIG. 7 is a view showing the comparator circuit 17 for multi-level memory cell. The comparator circuit 17 determines PASS/FAIL in each verification, with inputs of the signal PLOAD(3:0) applied from the input latch circuit 11, the signal PGM(3:0) applied from the write latch circuit 13, and the verify data DATAx applied from the sense amplifier circuit 6. The signal SELECT(3:0) divides the number of words in the write buffer according to the number of the memory cells simultaneously programmable. A signal SELB_LATCHB(k) forcibly makes the verify data pass on the verification, even if the verify data is the word that is not accessed by the user in the four words of the program group and is read out of the memory cell.

The comparator circuit 17 includes circuits 71 through 75. The circuit 71 includes an inverter 711. The inverter 711 generates the data DATAB with a verify data DATAx applied from the sense amplifier circuit 6. The data DATAB is input into transfer gates 734 and 735 in the circuit 73. The circuit 72 includes NAND circuits 721 through 725. NAND operation is performed for the signals SELECT(n) through the signal SELB_LATCHB(k) in the NAND circuits 721 through 724. The NAND operation is performed for this result in the NAND circuit 725, and a signal FMATCH(w) is generated. Here, w denotes a word designation number in each group, varying from 0 to 3. The circuit 72 is shown as a simplified one, yet for example, a signal FMATCH(0) is generated with signals SELB_LATCHB(0), SELB_LATCHB(4), SELB_LATCHB(8), and SELB_LATCHB(12). In the same manner, a signal FMATCH(1) is generated with signals SELB_LATCHB(1), SELB_LATCHB(5), SELB_LATCHB(9), and SELB_LATCHB(13).

For example, if 0-th and first words are accessed by the user, the SELB_LATCHB(0) and the SELB_LATCHB(1) are low, and a group 0 is to be programmed (SELECT(0) is high), the FMATCH(0) and the FMATCH(1) are low and the FMATCH(2) and the FMATCH(3) are high. If second and third words are accessed by the user, the gate signal of a transistor 736 is always low and controlled to pass on the verification in spite of the verify data read out of the memory cell. This makes it possible to make the unselected word in the group pass on the verification. 32 cells of the verification is performed simultaneously same as programming, and accordingly, the aforementioned forcible pass has to be controlled.

The circuit 74 includes a PMOS transistor 741, and transfer gates 742 through 745. The signal PGM(3:0) applied from the write latch circuit 13 is selected with the signals SELECTB(3:0) through SELECT(3:0), and a signal DVLOG is output. The signal DVLOG is input into a NOR circuit 732 in the circuit 73. The circuit 75 includes a PMOS transistor 751 and transfer gates 752 through 755. The signal PLOAD(3:0) applied from the input latch circuit 11 is selected by the signal SELECTB(3:0) through the signal SELECT(3:0), and a signal PLDATA is output. The signal PLDATA is input into an inverter 731 in the circuit 73.

The circuit 73 includes the inverter 731, NOR circuit 732 and 733, the transfer gates 734 and 735, and the NMOS transistor 736.

A signal of the result of the NOR operation of the signal FMATCH(w) and the signal DVLOG in the NOR circuit 732 and another signal of the result in the NOR circuit 733 of the NOR operation of the signal FMATCH(w) and the output from the inverter 731 that has received the signal PLDATA are selected by the signal DATAx and the signal DATAB. The selected signals control the gate of the NMOS transistor 736, and output a signal MATCHX to the control circuit 18. In this manner, the comparator circuit 17 compares the data read out in a verify period and the write data, and outputs the comparison result as the signal MATCHX. The circuit 73 is a wired-OR circuit, and there are provided 32 portions surrounded by a dotted line, connected to a terminal MATCHX. Even if one fails in verification, the signal MATCHX becomes low. This executes the program operation again. If all the bits are passed, the signal MATCHX becomes high. The control circuit 18 generates a signal to pass on the subsequent verification and programming for the group that has passed the verification after receiving the signal MATCHX.

Figure 8:
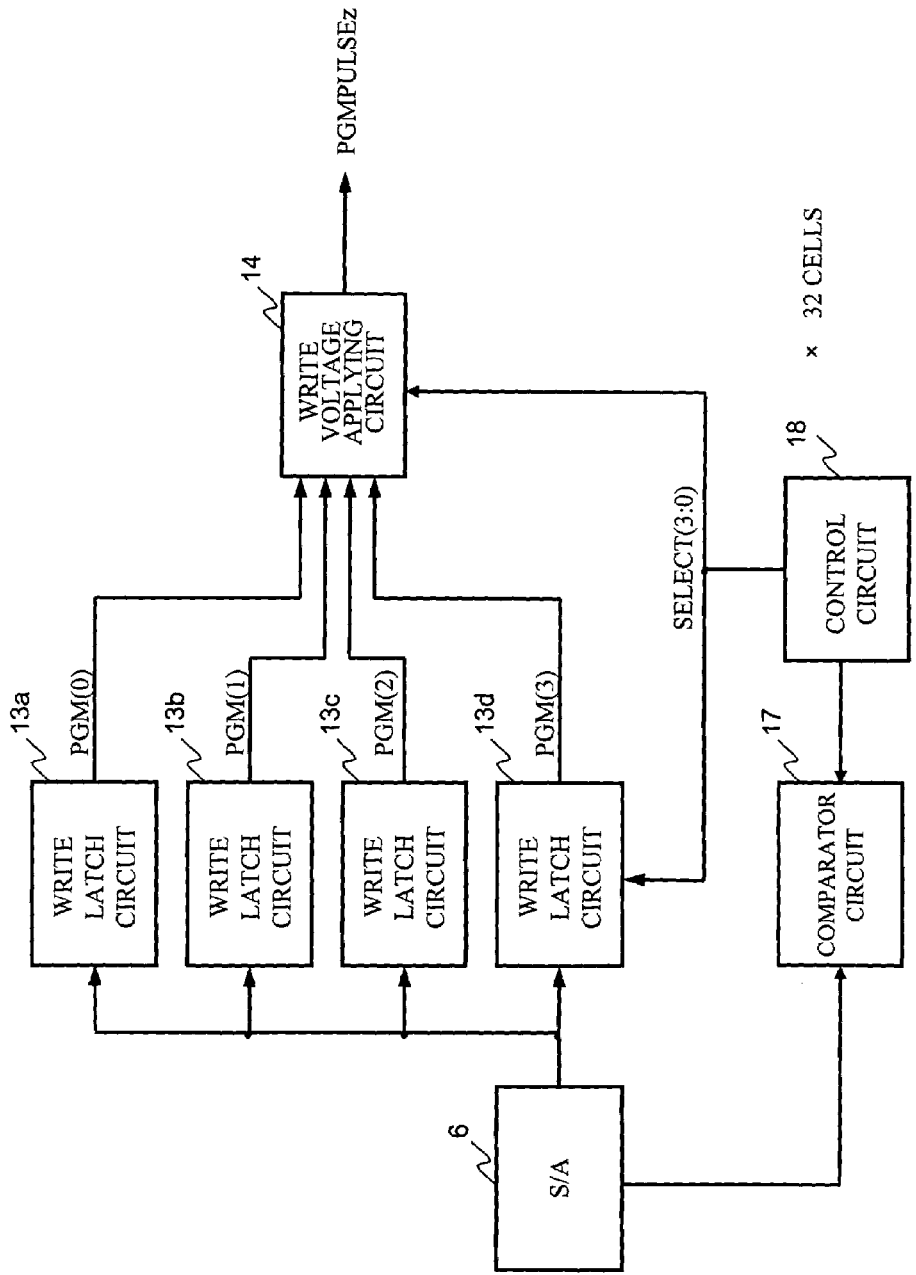
FIG. 8 is a view showing a conception of a write control method for the multi-level memory cell.

FIG. 8 is a view showing a control method of writing the multi-level memory cell. FIG. 8 includes the sense amplifier circuit 6, write latch circuits 13*a* through 13*d*, the write voltage applying circuit 14, the comparator circuit 17, and the control circuit 18. 32 cells are simultaneously programmable, and accordingly, there are provided 32 sense amplifier circuits 6, 32 write latch circuits 13*a* through 13*d*, 32 write voltage applying circuits 14, 32 comparator circuits 17, and 32 control circuits 18. If the write pulse is applied to four groups four times, the write signal PGM(n) is selected according to the decoding (SELECT(n)), and the write pulse is sequentially applied to the memory cell.

With this configuration, the write latch circuit 13*a* transfers the write data for the first group, which is one of four groups into which 16 words are divided, to the write voltage applying circuit 14. The write voltage applying circuit 14 writes the data into the memory cell according to a write data PGM(0) applied from the write latch circuit 13*a*. Next, the write latch circuit 13*b* transfers the second group of write data to the write voltage applying circuit 14. The write voltage applying circuit 14 writes the data into the memory cell according to a write data PGM(1) applied from the write latch circuit 13*b*. The write latch circuit 13*c* transfers the third group of write data to the write voltage applying circuit 14. The write voltage applying circuit 14 writes the data into the memory cell according to a write data PGM(2) applied from the write latch circuit 13*c*. The write latch circuit 13*d* transfers the fourth group of write data to the write voltage applying circuit 14. The write voltage applying circuit 14 writes the data into the memory cell according to a write data PGM(3) applied from the write latch circuit 13*d*. 32 cells can be simultaneously programmed for each group.

Figure 9:
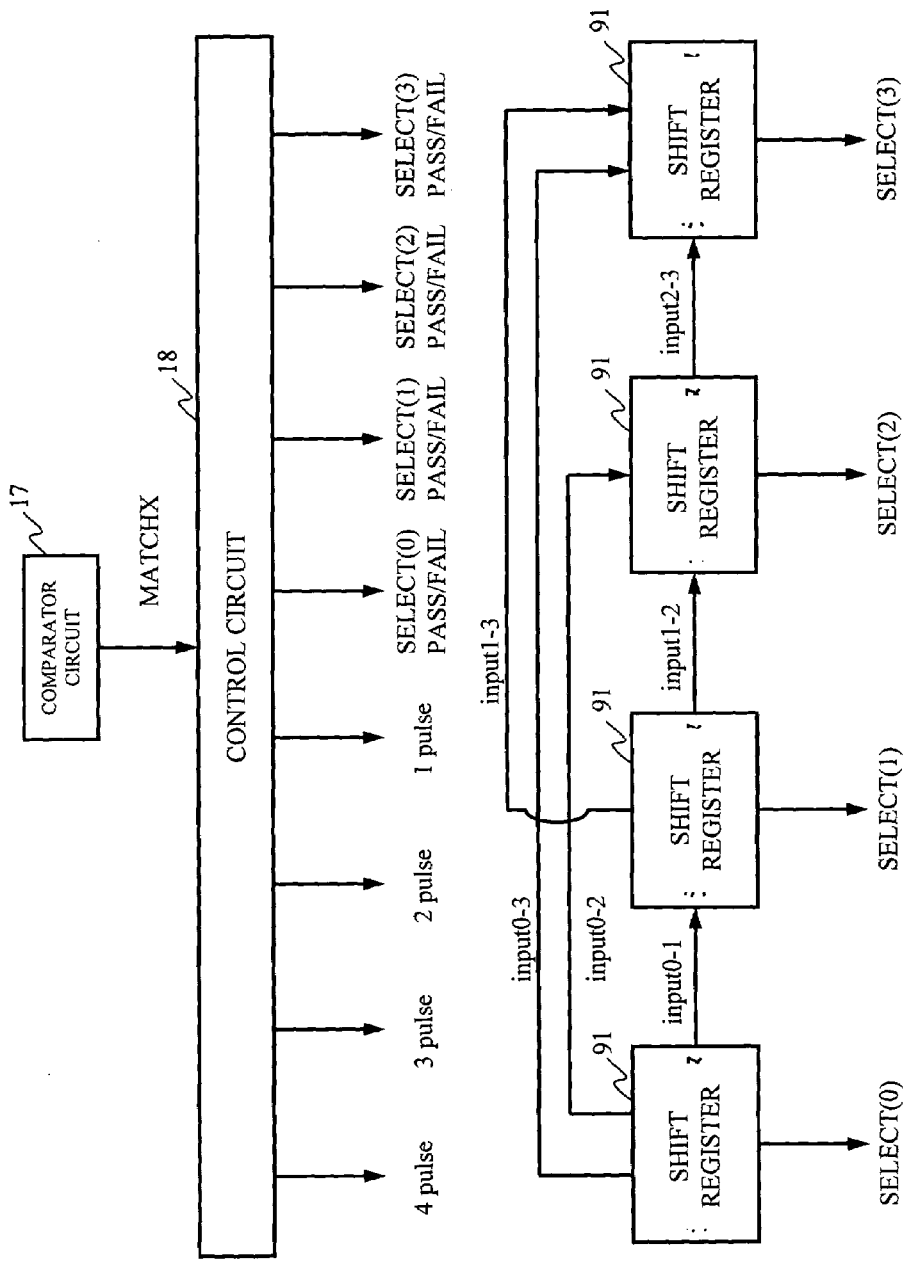
FIG. 9 is a view showing an increment counter of a four-word group in a 16-word write buffer.
Figure 10:
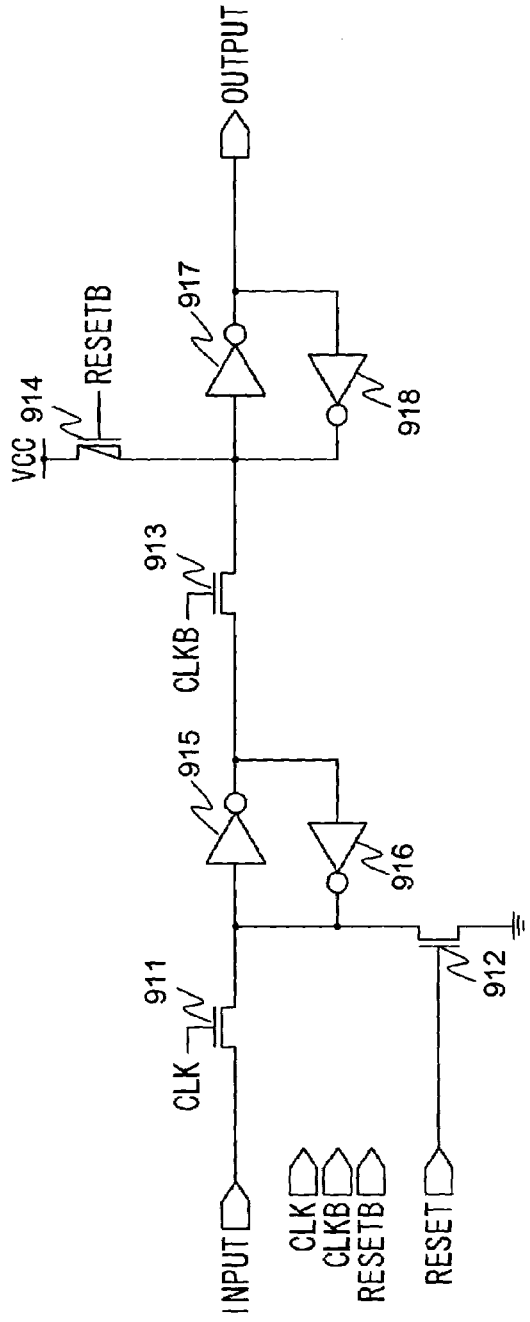
FIG. 10 is a view showing an example of a shift register used for the increment counter.

FIG. 9 is a view showing an increment counter for a four-word group in the 16-word write buffer, which is one of the features of the present invention. In FIG. 9, reference numeral 17 represents the comparator circuit, reference numeral 18 represents the control circuit, and reference numeral 91 represents a shift register. FIG. 10 is a view of an example of the shift register used in the increment counter. As shown in FIG. 10, the shift register 91 includes NMOS transistors 911 through 913, a PMOS transistor 914, and inverters 915 through 918.

The signal SELECT(3:0) is sequentially incremented by applying a signal OUTPUT in a former circuit to a signal INPUT. A signal CLK clocks according to eight control signals applied from the control circuit 18 shown in FIG. 8. The signal INPUT is input while the signal CLK is high, and the data is set at the latch composed of inverters 915 and 916. The signal INPUT is input while a signal CLKB is high, and the data set at the latch composed of inverters 915 and 916 is set at the latch composed of inverters 917 and 918.

Referring to FIG. 9 again, the control circuit 18 generates various control signals applied to the counter after receiving the determination of PASS/FAIL determined by the comparator circuit 17. Generally, the signal SELECT is sequentially incremented as 0-1-2-3. Here, a signal SELECT(2) is set to pass (low), the group 2 passes the next verification, and accordingly, the signal SELECT is incremented as 1-2-4 in the subsequent verification and programming. This time, input 1-3 is input into the shift register in a signal SELECT (3) instead of input 2-3.

In addition, the group 1 passes the next verification, the signal SELECT(1) is set to pass (low), the signal SELECT is incremented as 0-3 in the subsequent verification and programming. This time, input 0-3 is input into the shift register in the signal SELECT(3), instead of input 1-3. Further, the group 0 passes in the next verification, the signal SELECT(0) passes (low), only the group 4 is executed in the next verification and programming and the shift register is not incremented.

In this manner, the control circuit 18 generates the signal to pass on the subsequent verification and programming for the group that has passed the verification, after a given group of verification passes. It is possible to eliminate the verification and programming of unnecessary 4-word group. This makes it possible to accelerate the substantial write speed for every word. Here, the signal of 4 pulse denotes an instruction that all the four groups have to be verified and programmed, and the signal of 3 pulse denotes the instruction that only three groups have to be verified and programmed. By combining the aforementioned control signals and the signal indicating that which four-word group has passed the verification, the aforementioned increment counter can be realized.

Figure 11:
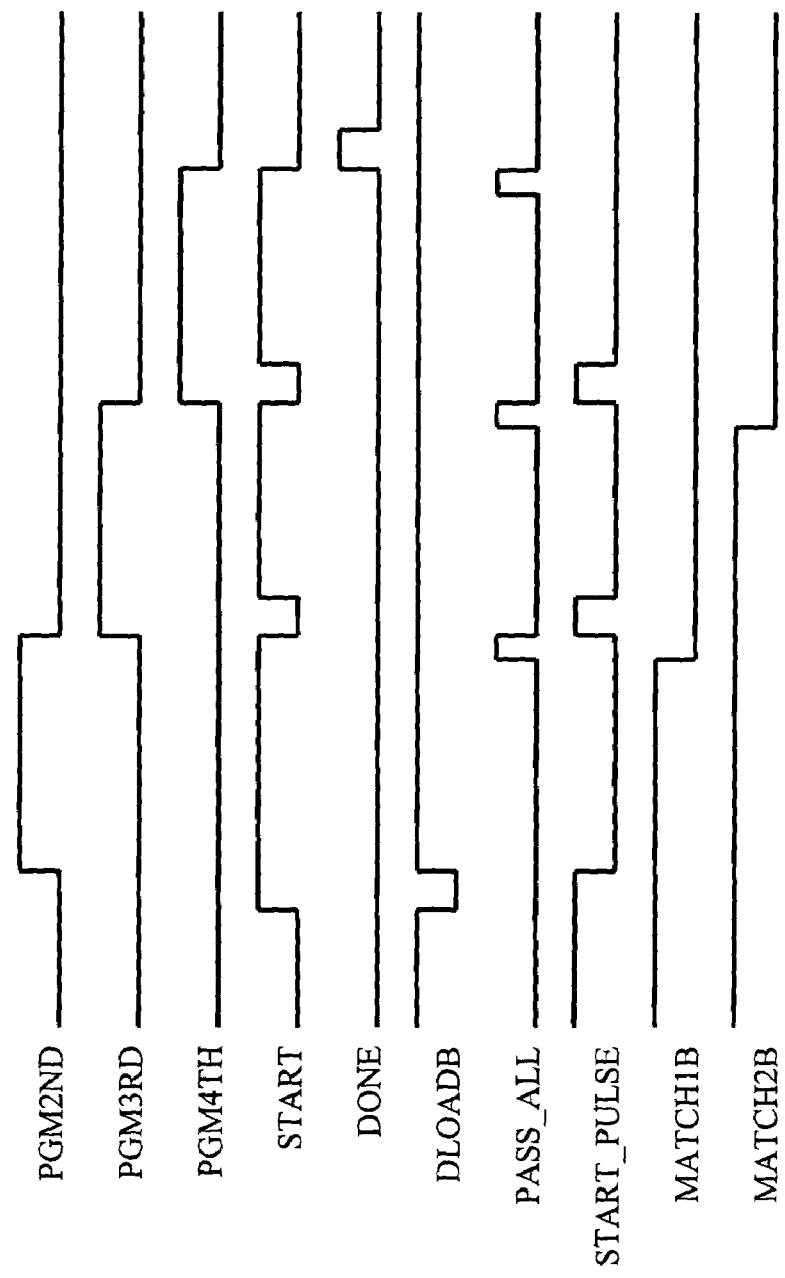
FIG. 11 shows a timing chart of q whole operation of the write buffer.

Next, a description will be given of the whole operation of the write buffer. FIG. 11 is a timing chart of whole operation of the write buffer. The signal DLOADB becomes low in the initial stage of the program operation, and the user input data is transferred to the input latch circuit 11 from the input buffer 2. The signal MATCH1B and the signal MATCH2B are both high, and the PGM2ND is executed on any one of the user input data of (0,1), (1,0), (0,0). The verification of all the cells is passed in the PGM2ND, a signal PASS_ALL(MATCHX) becomes high, and the signal MATCH1B becomes low.

The signal MATCH1B is low and the signal MATCH2B is high, and the PGM3RD is executed on either (1,0) or (0,0) of the user input data. The verification in all the cells is passed in the PGM3RD, the signal PASS_ALL becomes high, and the signal MATCH2B becomes low. The signal MATCH1B and the signal MATCH2B are both low, and the PGM4TH is executed on the user input data of (0,0). The PGM4TH is completed, and a pulse DONE becomes high and completes the process.

Figure 12:
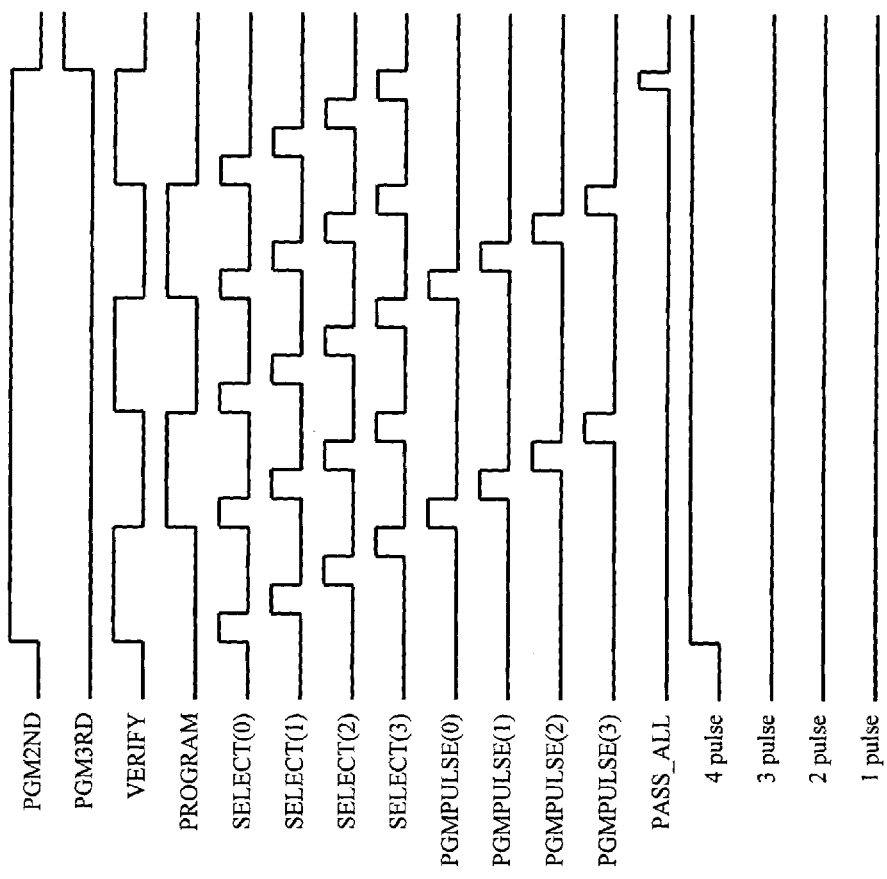
FIG. 12 shows a first timing chart in operation.

FIG. 12 is a timing chart of verifying all the groups. The verification and programming are alternately performed on multiple-group basis in the PGM2ND. The control circuit 18 sequentially increments the signal SELECT(3:0) to verify each group. The control circuit 18 sequentially increments the signal SELECT(3:0), generates a write pulse PGMPULSE(3:0) for each group in the write voltage applying circuit 14, and writes the data into the memory cell. The verification and programming are repeated on the multiple-group basis a given number of times.

The verification of all the cells is passed in the PGM2ND, the signal PASS_ALL becomes high, and is shifted to the PGM3RD. Here, according to the signal 4 pulse, the verification and programming are performed on all the four groups.

Figure 13:
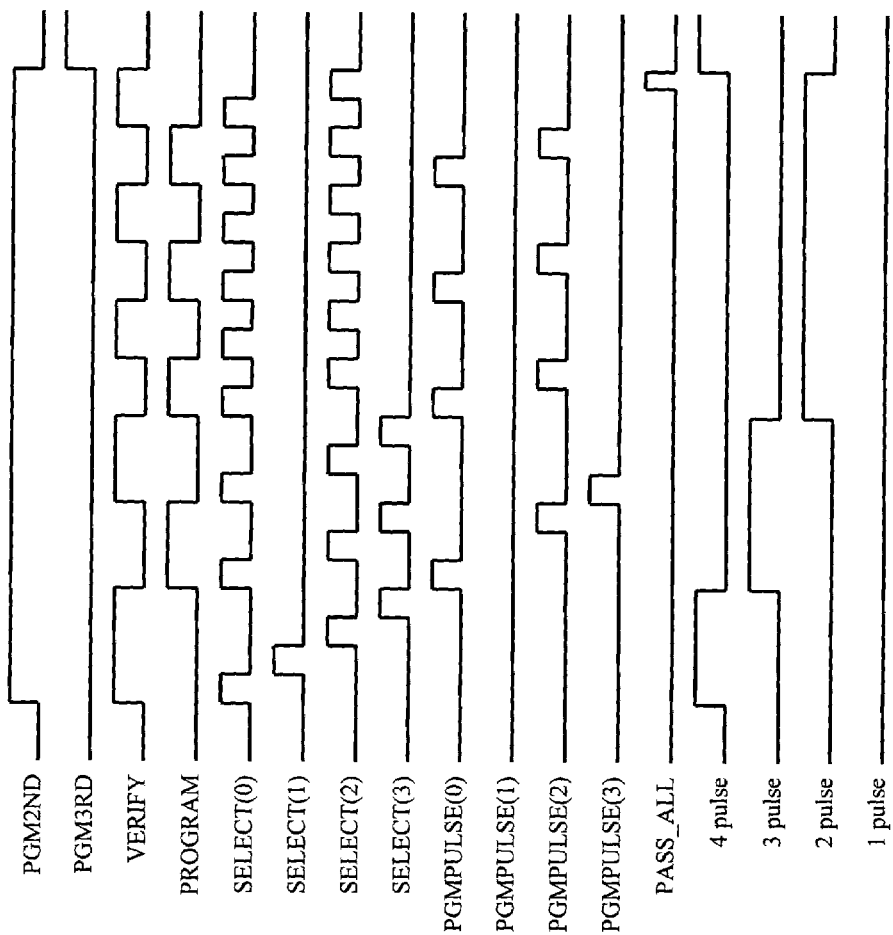
FIG. 13 shows a second timing chart in operation.

FIG. 13 is a timing chart in which the group that has passed the verification is considered. The verification and programming are alternately performed on multi-le-group basis in the PGM2ND. The control circuit 18 sequentially increments the signal SELECT(3:0), and verifies each group. The control circuit 18 sequentially increments the signal SELECT(3:0), generates the write pulse PGMPULSE (3:0) for each group in the write voltage applying circuit 14, and writes the data into the memory cell.

Generally, the signal SELECT is sequentially incremented as 0-1-2-3. Here, if the group 1 passes the first verification, the signal SELECT(1) is set to pass (low), the signal SELECT is incremented as 0-2-3 in the subsequent verification and programming. This time, input 0-2 is input into the shift register in the signal SELECT(2) instead of input 1-2. Further, if the group 3 passes the first verification, the signal SELECT(3) is set to pass (low), the signal SELECT is incremented as 0-2 in the subsequent verification and programming.

In this manner, all the four groups are verified by the signal 4 pulse in the first verification. If the group 1 passes the first verification, the three groups are verified by the signal 3 pulse in the next verification. If the group 3 passes the subsequent verification, the two groups are verified by the signal 2 pulse in the next verification.

The present circuit is capable of eliminating unnecessary verification and programming for the four-word group. This accelerates the substantial programming speed on a word basis.

In accordance with the embodiments, it is possible to provide the write buffer circuit employing the write method specific to the multi-level memory and to shorten the write period on the word basis substantially. The write latch circuit 13 corresponds to a first latch circuit, the input latch circuit 11 corresponds to a second latch circuit, the write voltage applying circuit 14 corresponds to a write circuit, and the comparator circuit 17 corresponds to a determination circuit.

Although a few preferred embodiments of the present invention have been shown and described, it would be appreciated by those skilled in the art that changes may be made in these embodiments without departing from the principles and spirit of the invention, the scope of which is defined in the claims and their equivalents. In the above-mentioned embodiments, the multi-level memory cell of 2 bits has been described as an example, however, the present invention is not limited to this.

What is claimed is:

1. A semiconductor device comprising:
   a first latch circuit that latches write information of multiple words, into which multiple-word input information is changed based on levels of a multi-level memory cell; and
   a write circuit that writes the write information of multiple words on a group basis in which one group is associated with a plurality of memory cells that are simultaneously programmable.

2. The semiconductor device as claimed in claim 1, further comprising a second latch circuit that changes the multiple-word input information to the write information of multiple words and transfers the write information thus obtained to the first latch circuit.

3. The semiconductor device as claimed in claim 1, wherein the first latch circuit transfers the write information to the write circuit on the group basis.

4. The semiconductor device as claimed in claim 2, wherein the first latch circuit comprises circuits that are equal in number to circuits that form the second latch circuit and are greater in number than circuits that form the write circuit.

5. The semiconductor device as claimed in claim 1, further comprising a control circuit that generates a signal that instructs verification and programming on the group basis.

6. The semiconductor device as claimed in claim 1, further comprising a control circuit that generates a signal for repetitive verification and programming on a multiple-group basis.

7. The semiconductor device as claimed in claim 5, further comprising a determination circuit that determines whether verification for a group passes, wherein the control circuit finishes verification and programming for a group for which the verification has passed.

8. The semiconductor device as claimed in claim 1, further comprising a control circuit that generates a signal that passes on verification for a word that is not selected in a group.

9. The semiconductor device as claimed in claim 1, further comprising a control circuit, wherein when the memory cell is sufficiently programmed at a first level, the control circuit generates a signal that instructs the memory cell to be programmed at a second level.

10. The semiconductor device as claimed in claim 1, wherein the semiconductor device is a semiconductor memory device.

11. A method comprising the steps of:
changing multiple-word input information to write information of words based on levels of a multi-level memory cell; and
writing the write information of multiple words on a group basis in which one group has associated therewith a number of memory cells that are simultaneously programmable.

12. The method as claimed in claim 11, further comprising a step of repetitively performing verification and programming on the group basis.

13. The method as claimed in claim 11, further comprising a step of repetitively performing verification on a multiple-group basis.

14. The method as claimed in claim 11, further comprising the steps of:
determining whether verification for a group passes; and
finishing verification and programming for the group for which verification has passed.

15. The method as claimed in claim 11, further comprising a step of passing on verification for a word that is not selected in a group.

16. The method as claimed in claim 11, further comprising a step of, when the memory cell is sufficiently programmed at a first level, generating a signal that instructs the memory cell to be programmed at a second level.

* * * * *